(12) United States Patent
Ge et al.

(10) Patent No.: US 12,373,180 B2
(45) Date of Patent: Jul. 29, 2025

(54) INTERPRETER FOR RECONFIGURABLE CRYPTOGRAPHIC ALGORTHMS BASED ON CUSTOMIZED HIGH-LEVEL C LANGUAGE

(71) Applicant: SOUTHEAST UNIVERSITY, Nanjing (CN)

(72) Inventors: Wei Ge, Nanjing (CN); Chongyang Li, Nanjing (CN); Qingxiao Zhou, Nanjing (CN); Yanhong Xu, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 207 days.

(21) Appl. No.: 18/223,724

(22) Filed: Jul. 19, 2023

(65) Prior Publication Data

US 2023/0359448 A1 Nov. 9, 2023

(30) Foreign Application Priority Data

Dec. 29, 2022 (CN) .......................... 202211710678.X (51) Int. Cl.
G06F 8/41 (2018.01)
(52) U.S. Cl.
CPC .............. G06F 8/443 (2013.01); G06F 8/433 (2013.01)
(58) Field of Classification Search
CPC ..................................................... G06F 8/443
See application file for complete search history.

(56) References Cited

U.S. PATENT DOCUMENTS

2002/0124033 A1* 9/2002 Takahashi ................. G06F 7/58
708/250

FOREIGN PATENT DOCUMENTS

CN 114661656 A * 6/2022

OTHER PUBLICATIONS

Podobas et al., "A Survey on Coarse-Grained Reconfigurable Architectures From a Performance Perspective," Jul. 27, 2020, IEEE Access, vol. 8, 25 pages.

(Continued)

*Primary Examiner* — Ziaul A Chowdhury
(74) *Attorney, Agent, or Firm* — Muncy, Geissler, Olds & Lowe, P.C.

(57) ABSTRACT

The present disclosure provides an interpreter of a reconfigurable cryptographic algorithm based on customized high-level C language, in the field of information security. The interpreter includes an input program of cryptographic algorithm customized language, a compilation optimization module, an intermediate file and data flow graph generation module, a mapping module and an array generation configuration code module. The disclosure provides an automatic mapping tool for the reconfigurable processor, which can take customized high-level C language as input, and the interpreter arranges and connects computing units like operators according to the input high-level C program, to complete the mapping of the whole computing function. This can shorten the development cycle of the reconfigurable system, reduce the hardware mastery requirements for users, map the computing units of different parts to the reconfigurable processor in a more optimized way, and effectively enhance the performance of the reconfigurable processor.

8 Claims, 6 Drawing Sheets

(56) References Cited

OTHER PUBLICATIONS

Zaidi et al., "A New Dataflow Compiler IR for Accelerating Control-Intensive Code in Spatial Hardware," May 19, 2014, 2014 IEEE 28th International Parallel & Distributed Processing Symposium Workshops, 10 pages.

Lin et al., "Exploiting parallelism of imperfect nested loops with sibling inner loops on coarse-grained reconfigurable architectures," Jan. 25, 2016, IEEE, 6 pages.

Lee et al., "Automatic mapping of control-intensive kernels onto coarse-grained reconfigurable array architecture with speculative execution," 2010 IEEE International Symposium on Parallel & Distributed Processing, Workshops and Phd Forum (IPDPSW) May 24, 2010, 4 pages.

Chang et al., "Mapping control intensive kernels onto coarse-grained reconfigurable array architecture," Nov. 24, 2008, IEEE, 2008 International SoC Design Conference, 4 pages.

Han et al., "Compiling control-intensive loops for CGRAs with state-based full predication," 2013 Design, Automation & Test in Europe Conference & Exhibition (DATE), Mar. 18, 2013, 4 pages.

Das et al., "Efficient mapping of CDFG onto coarse-grained reconfigurable array architectures," Jan. 16, 2017, IEEE, 6 pages.

Jo et al., "Coarse-grained reconfigurable architecture for multiple application domains: a case study," Aug. 27, 2009, International Conference on Convergence and Hybrid Information Technology 2009, 8 pages.

Rubattu et al., "Dataflow-Functional High-Level Synthesis for Coarse-Grained Reconfigurable Accelerators," Nov. 23, 2018, IEEE Embedded Systems Letters, vol. 11, No. 3, 4 pages.

Voitsechov et al., "Inter-thread Communication in Multithreaded, Reconfigurable Coarse-grain Arrays," 2018 51st Annual IEEE/ACM International Symposium on Microarchitecture (Micro), Jan. 16, 2018, 12 pages.

* cited by examiner

```
include <stdio.h> int main() {
    //#define N 100
    //#define SQRT 10
#define N 9
define SQRT 3 int A[N], B[N];
    long long C[N];
    int i, j;
    long long tmp;

for(i = 0; i < N; i++) {
        A[i] = i;
    } int sum1 = 0;
    for(i=0;i<N;i++){// The one-level loop is made with a tag being added
        //DFGloop:loop1
        tmp = 2 +A[i];
        tmp = tmp * tmp + tmp -1;
        B[i] = tmp * 3 +1;
        sum1 + = B[i];
        // printf("sum %d = %d\n",i,sum1);
    }
    long long sum = 0;
    for(i=0;i<SQRT;i++){//The two-level loop is made with no tag being added
        for(j=0;j<SQRT;J++){
            //DFGLoop:loop2
            int idx = i * SQRT + j ;
            tmp = 2 + B[idx];
            tmp = tmp * tmp *tmp + tmp * tmp + 10;
            C[idx] = (tmp + 10 ) * 2;
            //printf("C[%d]= %lld\n",idx,C[idx]);
            sum +=C[idx];
            //printf("sum %d = %lld\n",idx,sum);
        }
    }
    printf("sum = %lld\n", sum);

return sum;
}
```

INTERPRETER FOR RECONFIGURABLE CRYPTOGRAPHIC ALGORTHMS BASED ON CUSTOMIZED HIGH-LEVEL C LANGUAGE

TECHNICAL FIELD

The present disclosure relates to a design of a reconfigurable system chip compiler oriented to information security applications, in particular to an interpreter of a reconfigurable cryptographic algorithm based on customized high-level C language, belonging to the technical field of information security.

BACKGROUND

The reconfigurable processor has obvious advantages in energy efficiency ratio, which combines high performance of Application Specific Integrated Circuit (ASIC) and flexibility of General Purpose Processor (GPP), thus attracting widespread attention from all sectors. For the reconfigurable processor, its flexibility is reflected in users' ability to configure the hardware's computational functions, while the high performance stems from the adoption of hardware parallel computing methods. However, the configuration scheme often becomes the key factor that affects the computational performance when implementing a particular computational function. As the computational units and storage resources of reconfigurable processors need to be combined with the characteristics of the application program in both time and space dimensions, it increases the difficulty of algorithm mapping. In this context, a mapping process of algorithms on the reconfigurable processor is often completed manually. However, the manual configuration method has drawbacks such as long time, unstable results, and high error rate. Traditional compilation technology mainly target serial general-purpose processors based on instruction sets, which cannot solve a mapping problem of a parallel reconfigurable processor based on Data Flow Graph (DFG). Therefore, how to effectively and efficiently map computational functions to reconfigurable processors by combining their structural and resource characteristics has become a current research hotspot and difficulty in the current reconfigurable field. Automatic mapping tools for the reconfigurable processor can not only shorten the development cycle of reconfigurable systems, but also optimize users' required computational functions on the reconfigurable processor, thus effectively improving performance. Therefore, they have become an indispensable part of reconfigurable systems.

The implementation of cryptographic algorithms is one of the important goals of high performance processor design and application, and reconfigurable processors for cryptographic algorithms are typical representatives of the proprietary domain of reconfigurable processor structures. Different from other computing functions, the cryptographic algorithm has characteristics of "confusion" and "diffusion", and the data computation is interlaced and complex. Therefore, research on automatic reconfigurable mapping technology of the cryptographic algorithm is more challenging and valuable.

Figure 1:
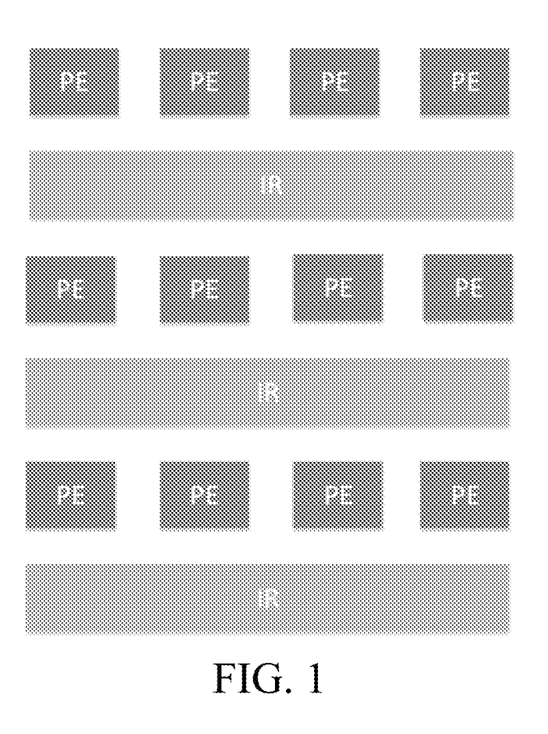
FIG. 1 is a schematic structural diagram of a reconfigurable computing unit RCA.

The reconfigurable processor has the same characteristics as ASIC in terms of computational ability, directly processing parallel computing and data transmission through circuits, thus having high computational performance. However, unlike AISC, the computational functions of the reconfigurable processor can be changed by its internal reconfiguration operations. The variability of the computational functions gives reconfigurable processors the same flexibility as GPP, but compared to the one-dimensional functional configuration of GPP in series, the parallel two-dimensional functional configuration in reconfigurable processors is more challenging. In reconfigurable processors, the calculation is is usually carried out by a two-dimensional array known as the Reconfigurable Computing Array (RCA), as shown in FIG. 1, which is composed of many function-configurable Processing Elements (PE) and line-configurable Interface of outers (IR), where the former realizes data computation and the latter realizes data circulation. The operation of configuring computational functions onto the RCA is called mapping, and the goal of mapping is to correctly and efficiently implement the computational functions in the RCA. Therefore, the mapping results are the key to whether reconfigurable processors can achieve high performance.

In the absence of automatic mapping tools, manual mapping is the only choice for users when using reconfigurable processors. Currently, automatic mapping technology is not mature, which has led to manual mapping becoming the choice of some small institutions. However, manual mapping has the following obvious drawbacks:
  (1) Mapping personnel are required to be highly knowledgeable about both the computational functions and array structure.
  (2) The time cost of mapping is high, requiring a significant amount of time to analyze the function, array, layout, wiring, and adjustments.
  (3) The mapping results may not be good or consistent, and different mapping personnel may produce different configuration results.
  (4) The lack of hardware flexibility requires manual remapping whenever there are changes in the array structure.

In comparison, automatic mapping has the advantages of speed and good results, avoiding the drawbacks of manual mapping. Therefore, it has become an indispensable part of reconfigurable systems. Furthermore, traditional mature compilation techniques cannot be directly applied to reconfigurable mapping problems, making automatic mapping technology a current research hotspot in the field of reconfigurable computing.

Currently, research on the architecture of reconfigurable processors tailored for specialized fields is a hot topic, and the widespread application scenarios of cryptographic algorithms make reconfigurable processors aimed at these algorithms a typical representative. While the computational form of ordinary computing is often simple and straightforward to achieve general functionality, cryptographic algorithms, as algorithms in the security field, require intricate and complex data calculations to uncouple ciphertext and plaintext and enhance the security level of the ciphertext. Therefore, compared to ordinary computing, manually mapping cryptographic algorithms has numerous drawbacks in terms of the requirements for mapping personnel, mapping time, and mapping effects. At present, the research on reconfigurable technology for cryptographic algorithms mainly focuses more on the study of its array structure, and there are also manual mapping schemes targeting specific cryptographic algorithms. However, there is not much research on automatic mapping technology, which has resulted in manual mapping being the only choice for some institutions, severely delaying the system development cycle. Therefore, research on automatic mapping technology for reconfigurable processors aimed at cryptographic algorithms is highly urgent, and its importance is self-evident.

Given the above background, the design of compilers for reconfigurable cryptographic chips aimed at information security has become a hot research topic. The existing compiler tool designs for reconfigurable chips based on cryptographic algorithms have been optimized to a certain degree. However, due to the differences in hardware structure and input languages in practical applications, there are certain differences in the design of their compiler solutions.

SUMMARY

In order to solve above problems, the present disclosure provides an interpreter of a reconfigurable cryptographic algorithm based on customized high-level C language, which solves problems of high requirements for mapping personnel, long time period, poor mapping effect and poor tolerance for hardware changes in a case that existing mapping technology is not mature enough.

To achieve the above objective, the present disclosure provides the following technical schemes.

An interpreter for reconfigurable cryptographic algorithms based on customized high-level C language comprises an input program for the custom language of cryptographic algorithms, a compiler optimization module, a module for generating intermediate files and/or data flow graphs, a mapping module, and an array generation configuration code module.

The input program for the customized language of cryptographic algorithms is implemented using custom high-level C language. The compiler optimization module includes a hardware and software partition unit, a hardware code optimization unit, a hardware code compilation unit, and a software compilation and linkage unit. The hardware and software partition unit is used to add comments to the loop body to mark the hardware code. The hardware code optimization unit is used to rewrite the marked hardware code based on the code specification for hardware functions. The hardware code compilation unit contains the source files and several functional units for compiling the code. The software compilation and linkage unit are used to link the symbols produced by different compilation units to form an executable program.

Further, the hardware code optimization unit utilizes operators such as BFU, SBOX and BENES for code optimization.

Further, a process of using the BFU operator for optimization includes:
1: determining an operand to be operated and a modular operation mode to be processed according to needs of the algorithm, and assigning three inputs A, B and T of a function and the modular operation mode to be processed respectively;
2: selecting and determining a BFU function to be realized according to a BFU operator function realization scheme, and transferring a parameter to an operator function func, a specific calculation operator being selected inside the function according to the parameter;
3: specifying relevant input and output parameters for operators that need to be realized at a bottom layer of the function, and setting according to the BFU operator function realization scheme, and completing final encapsulation; and
4: transferring parameters to be output to a result output X and a bypass output Y.

Further, a process of using the SBOX operator for optimization includes:
1: using lookup table resources as much as possible, each lookup table being divided into two, upper and lower, sub-lookup tables of 256×32; and selecting and searching different sub-lookup tables according to 1-bit group configuration or selecting which bits of 32 bits as valid data to output according to 2-bit byte_sel configuration;
2: with four tables in each SBOX, dividing each table into eight small tables according to the group configuration and byte_sel configuration; and
3: performing relevant encapsulation at a bottom layer of the function according to a SBOX function realization scheme table.

Further, a process of using the BENES operator for optimization includes:
1: determining input and output function parameters;
2: using a N×N BENES permutation unit to realize all selection transformations of N inputs and N outputs at the bottom layer of the function, that is, any one of the N outputs of the N×N permutation unit being capable of selecting any one of the N inputs, and a number of configuration bits required by BENES128 being determined by a formula $$BENES(N) \cdot length = \left(\frac{n}{2}\right) * (2 * \log_2(n) - 1);$$

3: saving permuted data unit for subsequent use.

Further, the code rewritten by the hardware code optimization unit supports two-level For loop nesting at most.

Further, when a Loop is with only one level of loop, it is realized by using a single-layer For loop, and the For loop is made by adding a tag according to software and hardware division specification. When a Loop is with two levels of loops, it is realized by using a two-layer For loop, where an outer layer corresponds to a second level of loop, and an inner layer corresponds to a first level of loop. An outer layer of For loop does not need to be added with a tag, and an inner layer of For loop is made by adding a tag according to the software and hardware division specification.

Further, the tag is used for extracting an innermost loop body, the innermost loop body is mapped to the array for processing, and outside of the loop body is run by software.

Further, the BENES operator is used for realizing a permutation function of nonlinear operation bits.

Further, the mapping module maps a corresponding operator function into a fixed operator icon.

Compared with existing technologies, the present disclosure has the following advantages and beneficial effects.
1. The present disclosure provides an automatic mapping tool for the reconfigurable processor, which can take customized high-level C language as input, and the interpreter arranges and connects computing units such as operators in a manner set by the program according to the input high-level C program, so as to complete the mapping of the whole computing function. In this way, not only the development cycle of the reconfigurable system can be shortened, but also requirements for users to master the hardware can be reduced, so as to map computing functional units of various parts to the reconfigurable processor in a more optimized way, and further improve performance of the reconfigurable processor effectively.
2. The interpreter of the reconfigurable cryptographic algorithm based on customized high-level C language provided by the present disclosure realizes automatic mapping, which has characteristics of high speed and good effect, and overcomes defects of high requirements for personnel of mapping algorithm and familiarity with computing functions and arrays.
3. Using designed input based on a customized type of language, it is only required to write corresponding software codes without spending a lot of time on steps such as functional analysis, array analysis, layout and routing, and adjustment of operators, which greatly reduces mapping cost.
4. A problem that performance structures of the algorithm configured by different mapping personnel are inconsistent, and thus uneven mapping effect, can be avoided.
5. The scheme of the present disclosure has good hardware tolerance, and when the array structure changes, it is unnecessary to manually map and change the schemes again.

DETAILED DESCRIPTION

Technical schemes provided by the present disclosure will be described in detail with reference to specific embodiments below, and it should be understood that the following specific embodiments are only intended to illustrate the present disclosure and are not used for limiting the scope of the present disclosure.

Figure 2:
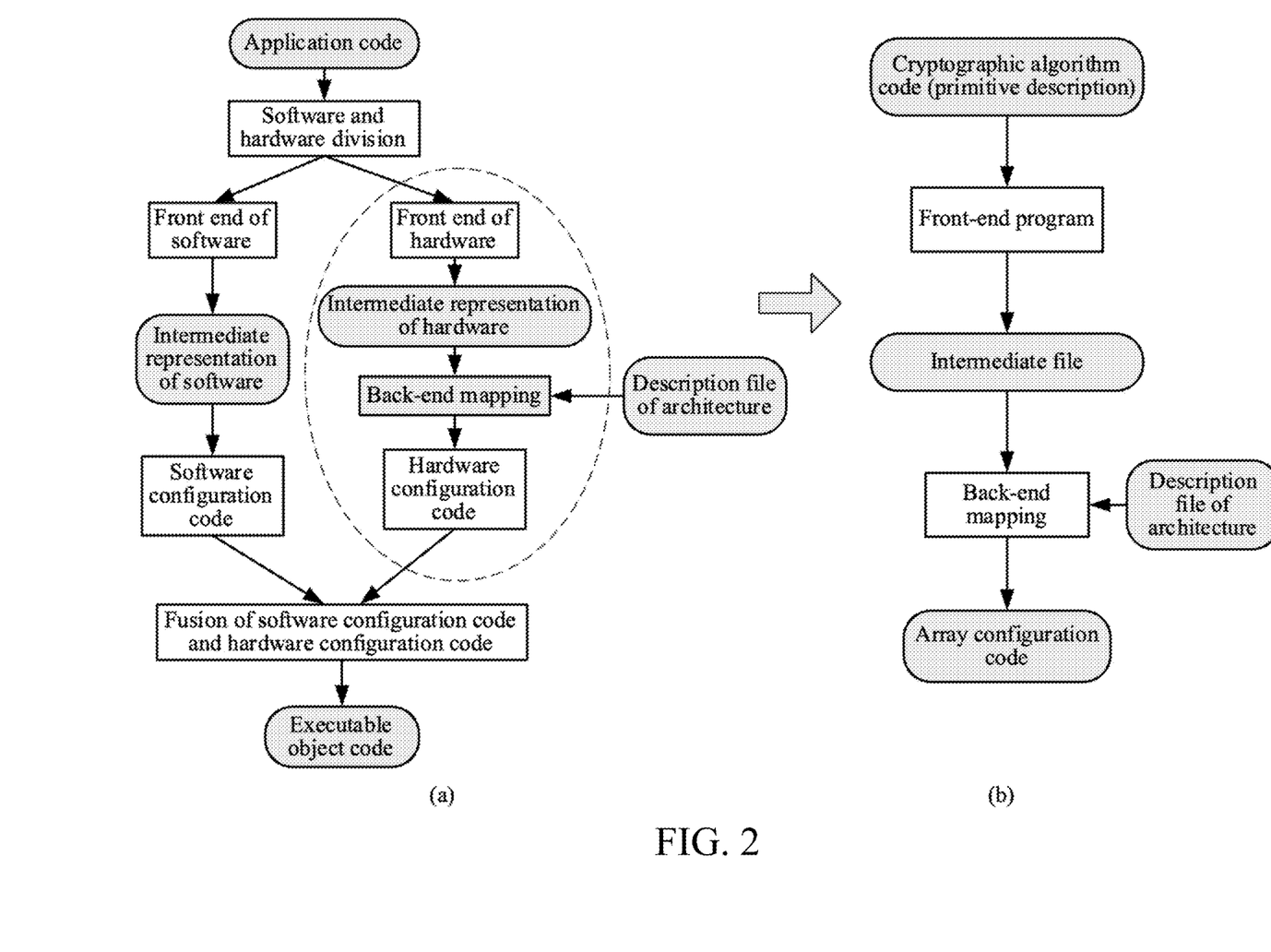
FIG. 2 is an overall compilation framework and a simplified compilation framework for reconfigurable mapping for realizing the present disclosure, where (a) is the overall compilation framework and (b) is the simplified compilation framework for reconfigurable mapping.

The overall compilation framework for realizing the present disclosure is shown in (a) in FIG. 2, and an interpreter of a reconfigurable cryptographic algorithm based on customized high-level C language provided by the present disclosure is improved on a basis of a dashed oval box part in (a), specifically including: an input program of cryptographic algorithm customized language, a front-end compilation optimization module, an intermediate file generation module, a back-end mapping module and an array generation configuration code module.

The input program of cryptographic algorithm customization language includes extended special domain language based on standard C language, and the input program includes programming of built-in functions such as BFU, SBOX and BENES. In order to improve performance of a mapped hardware circuit, the extended language of standard C language is designed as input language. Extended C language design should focus on the following points:
(1) There is no need for logical determination statement, because there is no inevitable logical determination statement in the cryptographic algorithm and there is no corresponding function in a computing array.
(2). There is no need for loop statement containing complex logical determination, but there is need for loop statement containing loop number information, among which the following two points should be noted for a second level of loop:

When a Loop is with only one level of loop, it is realized by using a single-layer For loop. The For loop is made by adding a tag according to software and hardware code division specification.

When a Loop is with two levels of loops, it is realized by using a two-layer For loop. An outer layer corresponds to a second level of loop, and an inner layer corresponds to a first level of loop. An outer layer of For loop does not need to be added with a tag, and an inner layer of For loop is made by adding a tag according to the software and hardware code division specification. Programming examples can be referred.

(3) Special built-in functions are needed to represent some special computation. Operator functions LU, SU, AU and MU are all combinations of simple operations, which can be expressed by ordinary expressions, while nonlinear operations such as searching a table lookup and permutation cannot be expressed by ordinary expressions, so it is necessary to design built-in functions for them.

The front-end compilation optimization module includes a software and hardware division unit, a hardware code optimization unit, a hardware code compilation unit and a software compilation link unit.

Figure 3:
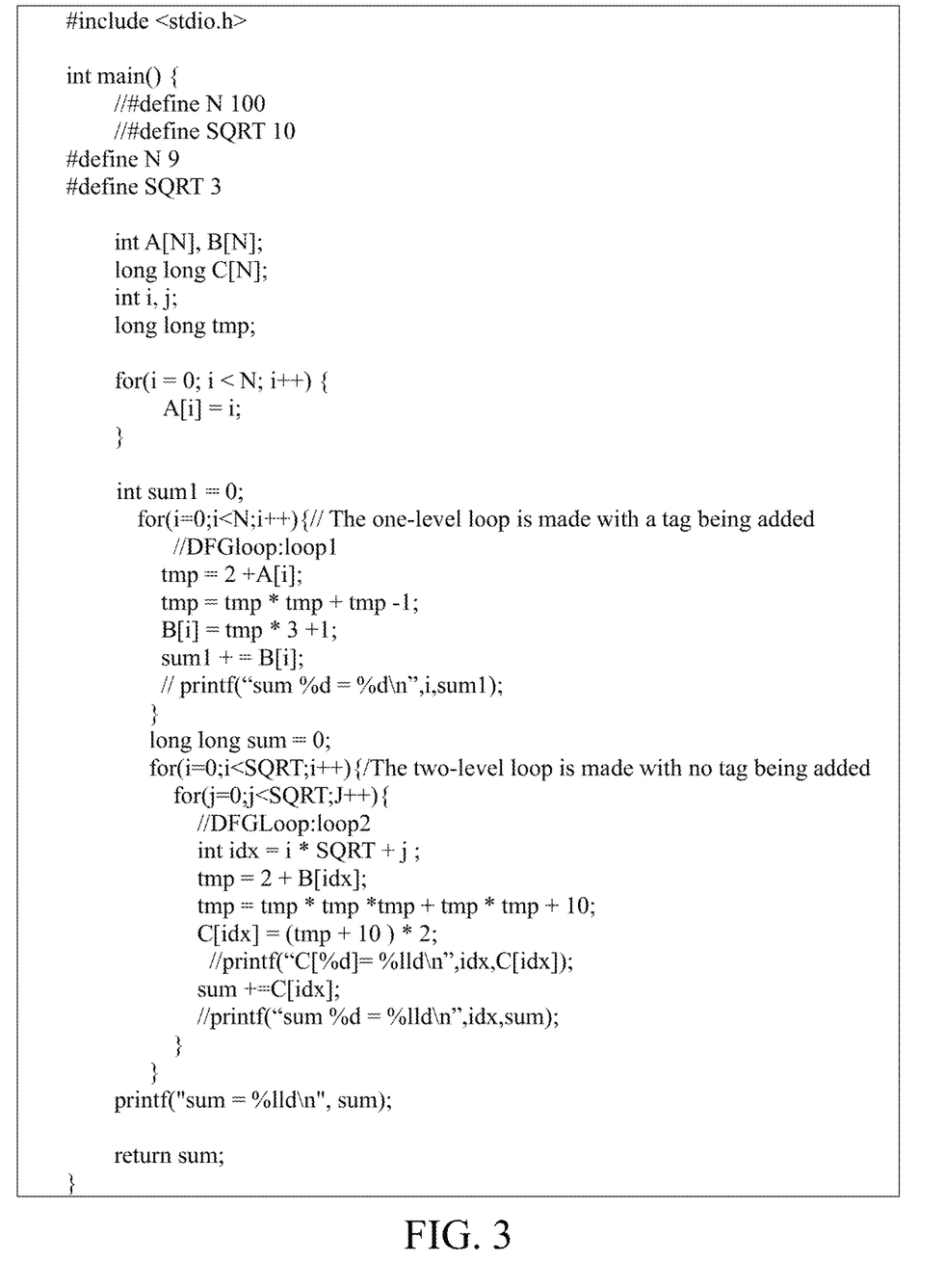
FIG. 3 is an example of a tagged loop of software and hardware division according to the present disclosure.

The software and hardware division unit is used for adding comments (//DFGloop) to the loop body and tagging the hardware code. RCA only extracts an innermost loop body and maps it to the array for processing. FIG. 3 is a code example of a tagged loop of software and hardware division. In a source code, the loop needs to be tagged as required, and the innermost loop body is extracted using the tag, and the loop body is mapped to the array for processing. Outside of the loop body is run by software.

The hardware code optimization unit is configured to rewrite the tagged hardware code according to code specification realized by hardware function.

The hardware code compilation unit contains a single source file with all necessary information, and contains necessary units for compiling all contents (including contents of the source file, such as header files.) and its own contents (programs for its own).

The software compilation link unit is configured to link symbols generated in different compilation units to form an executable program.

Based on the above extended C language design, the code specification is: only two-layer For loop nesting is supported at most, and irregular loops such as while are not supported; the internal coding of the loop body does not support pointers and recursive calls; and the BFU, SBOX and BENES operators are used for programing.

Figure 4:
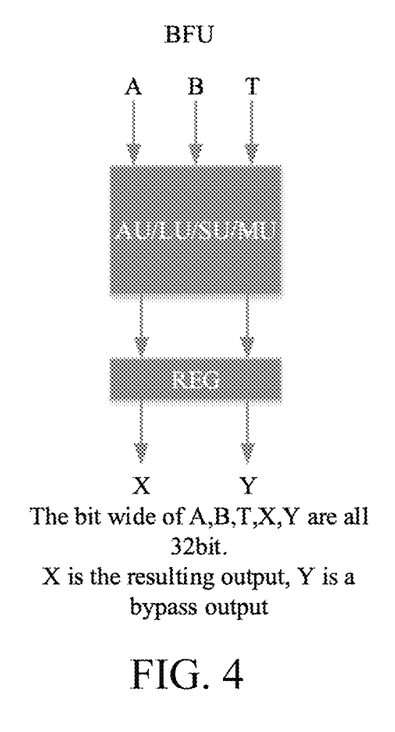
FIG. 4 is a schematic structural diagram of a BFU computing module according to the present disclosure.

As shown in FIG. 4, the BFU operator can realize addition operation (AU), logic operation (LU), shift operation (SU) and multiplication operation (MU). Each BFU unit has three 32-bit inputs and two 32-bit outputs. Three inputs of BFU are named A, B and T respectively, and the outputs are named X and Y, where X is a result output and Y is a bypass output. A REG register unit in the operator can temporarily register a computation structure of BFU computation, and when the output is received or CMD is called, X and/or Y can be output. The function is defined as int*BFU(int a, int b, int t, char*func, char *exp, int bypass, char *bypassExp, int mode), where a, b and t are input parameters of the BFU operator; Func is a BFU operator function: lu, au, su, and mu; exp is an expression realized by BFU: for example, A to B; bypass is an input, with a value of 0 to 3, 0: A, 1: B, 2: T, 3: B; bypassExp is an expression of bypass; mode is a modular operation to be processed, with a value of 0 to 3, 0:$2^{32}$, 1:$2^{16}$, 2:$2^8$, 3:$2^{31}$-1; and a return value is two outputs for which an int pointer points to BFU, which can be used directly after being called by the BFU function. A specific realization process of the BFU operator is as follows:

1: determining an operand to be operated and a modular operation mode to be processed according to needs of the algorithm, and assigning A, B and T of a function and mode respectively;

2: selecting and determining a BFU function to be realized according to a BFU operator function realization scheme, and transferring a parameter to func, a specific calculation operator being selected inside the function according to the parameter;

3: specifying relevant input and output parameters for operators that need to be realized at a bottom layer of the function, and setting according to the BFU operator function realization scheme in table 1, where specific realization schemes of AU and MU operators are shown as in table 2 and table 3, and LU and SU can be realized according to relevant logic function requirements, and completing final encapsulation; and 4: transferring parameters to be output to X and Y.

TABLE 1

| Operator name | Realizable logical operation |
|---|---|
| Logical operation (LU) | 1. Logical operations can be realized: AND, OR, and XOR; 2. A three-layer laminated structure is used, any logical expression with three inputs can be realized (a single input appears in the expression no more than twice); and 3. Any one of the three inputs can be bypass output; |
| Shift operation (SU) | 1. Logical left shift, logical right shift, loop left shift and loop right shift can be realized; 2. A double-barrel 32-bit shifter structure is used, a single operator can realize two shift operations at the same time; 3. Two shift operands (A/B) can be selected to be logically operated with a third operand T before shifting; 4. Operator results can be selected to output an output result of a barrel shifter 0, or a XOR result of output data of barrel shifters 0 and 1 and LBC (Logic Basic Compution), or a XOR result of output data of barrel shifters 0 and 1 and T; and 5. Any data of the three inputs and an output of a barrel shifter 1 can be bypass output; |
| Addition operation (AU) | 1. Realization can be selected as parallel 4-way modular $2^8$ addition, or parallel 2-way modular $2^{16}$ addition, or 1-way modular $2^{32}$ addition, or 1-way modular $2^{32}$ -1 addition; 2. The operation result can be selected as an addition result or a logical (AND, OR, and XOR) result of the addition result and a third operand; 3. Addition operation with carry can be supported, and an operation X = A + B + T can be performed, where a $0^{th}$ bit of T is valid in a 32-bit addition mode; a 0/$16^{th}$ bit is valid in a 16-bit addition mode; a $0^{th}/8^{th}/16^{th}/24^{th}$ bit is valid in a 8-bit addition mode; and carry addition is set invalid in a 1-way modular $2^{32}$ -1 addition mode; and 4. Any one of the three inputs can be bypass output, carry output can be supported, where a $0^{th}$ bit of Y is a carry output in the 32-bit addition mode, and it is similar to an input T in other modes; |
| Multiplication operation (MU) | 1. 16-bit multiplication can be realized, X[31:0] = A[15:0] * B[15:0]; 2. 8-bit multiplication can be realized, X[31:0] = {8'b0, A[7:0]} *{8'b0, B[7:0]}; and 3. Any one of the three inputs can be bypass output; |

TABLE 2

| Modular addition mode | Carry mode | Functional pseudo-code |
|---|---|---|
| Parallel 4-way modular $2^8$ addition | Without carry | X[7:0] = A[7:0] + B[7:0]; X[15:8] = A[15:8] + B[15:8]; X[23:16] = A[23:16] + B[23:16]; X[31:24] = A[31:24] + B[31:24]; |
| Parallel 2-way modular $2^{16}$ addition | Without carry | X[15:0] = A[15:0] + B[15:0]; X[31:16] = A[31:16] + B[31:16]; |
| 1-way modular $2^{32}$ addition | Without carry | X[31:0] = A[31:0] + B[31:0]; |
| 1-way modular $2^{32}$ -1 addition | Without carry | X[31:0] = (A[31:0] + B[31:0])Mod($2^{32}$-1); |
| Parallel 4-way modular $2^8$ addition | With carry | {Y[0], X[7:0]} = A[7:0] + B[7:0] + T[0]; {Y[8], X[15:8]} = A[15:8] + B[15:8] + T[8]; {Y[16], X[23:16]} = A[23:16] + B[23:16] + T[16]; {Y[24], X[31:24]} = A[31:24] + B[31:24] + T[24]; |

TABLE 2-continued

| Modular addition mode | Carry mode | Functional pseudo-code |
|---|---|---|
| Parallel 2-way modular $2^{16}$ addition | With carry | {Y[0], X[15:0]} = A[15:0] + B[15:0] + T[0];<br>{Y[16], X[31:16]} = A[31:16] + B[31:16] + T[16]; |
| 1-way modular $2^{32}$ addition | With carry | {Y[0], X[31:0]} = A[31:0] + B[31:0] + T[0]; |
| 1-way modular $2^{32}$ -1 addition | With carry | X[31:0] = (A[31:0] + B[31:0])Mod($2^{32}$-1);<br>Note: Carry configuration has no effect on this mode. |

TABLE 3

| Multiplication mode | Functional pseudo-code |
|---|---|
| 16-bit multiplication | X[31:0] = A[15:0] * B[15:0];<br>Y[31:0] = 0; |
| 8-bit multiplication | X[15:0] = A[7:0] * B[7:0];<br>X[31:16] = A[7:0] * B[15:8];<br>Y[15:0] = A[15:8] * B[7:0];<br>Y[31:16] = A[15:8] * B[15:8]; |

Figure 5:
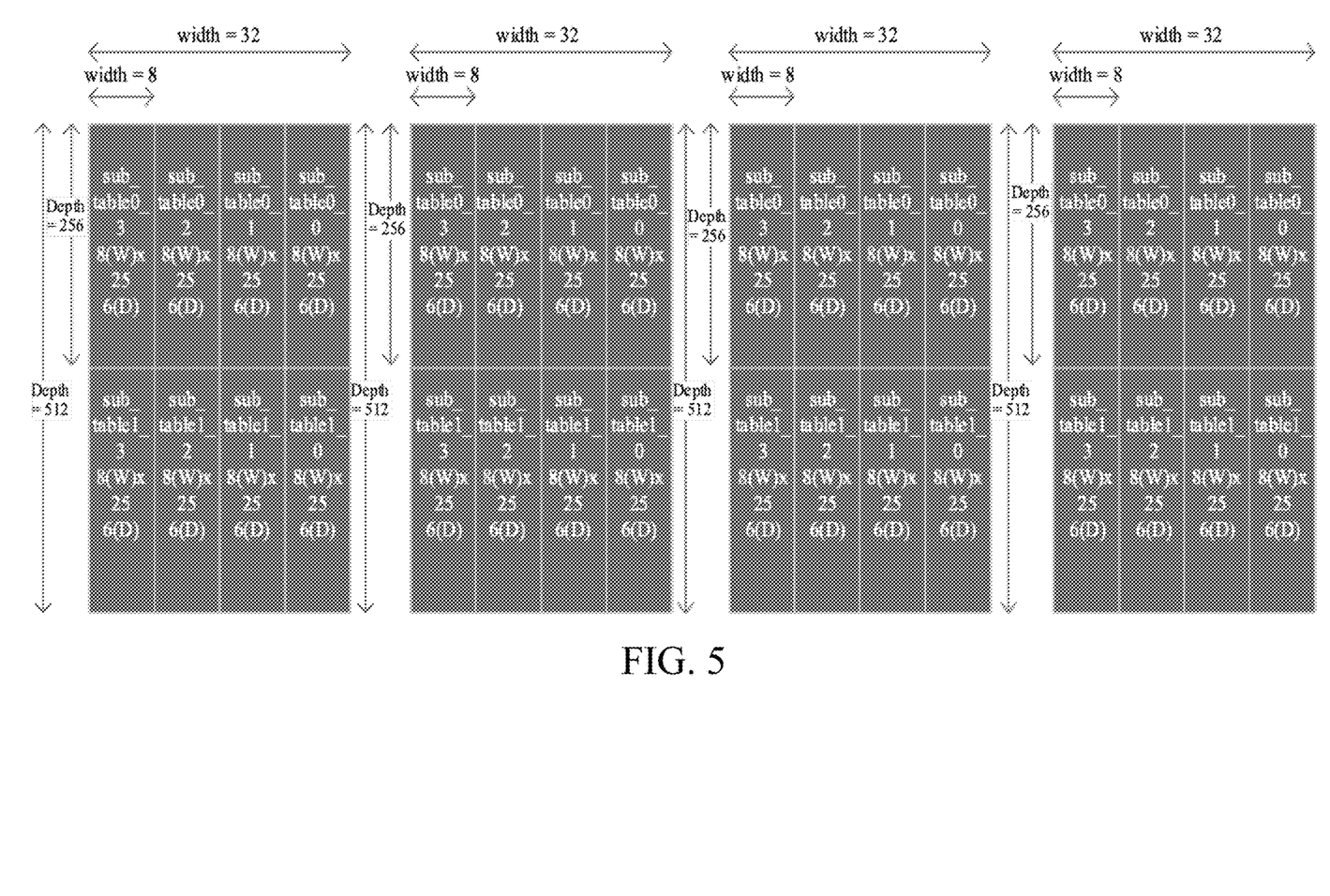
FIG. 5 shows a schematic diagram of a SBOX lookup table according to the present disclosure.

As shown in FIG. 5, SBOX is a nonlinear lookup unit, and there are four SBOX in a reconfigurable configuration line, and each SBOX has four lookup tables. Considering to use the lookup table resources as much as possible, each lookup table is divided into two, upper and lower, sub-lookup tables, and different sub-lookup tables are selected and searched according to 1-bit group configuration. At the same time, SBOX has different modes so as to realize different lookup functions. The function is defined as int*SBOX(int a, int mode, char *src, int id0, int id1, int id2, int id3), where a is an input parameter of a SBOX operator, mode is a splicing mode of SBOX, with a value of 0 to 7, 0: supports parallel 4-input/4-output look-up table (LUT) operations, and concatenates the output; 1: supports parallel 4-input/4-output look-up table (LUT) operations, with input data of 6 bits and output data of 4 bits, and concatenates the output; 2: supports parallel 4-input/4-output look-up table (LUT) operations, with input data of 8 bits and output data of 8 bits, and concatenates the output; 3: supports parallel 4-input/4-output look-up table (LUT) operations, with input data of 8 bits and output data of 8 bits, and XORs the output; 4: supports parallel 4-input/4-output look-up table (LUT) operations, with input data of 8 bits and output data of 32 bits; 5: supports single-input/single-output look-up table (LUT) operations, with input data of 9 bits and output data of 9 bits; 6: supports single-input/single-output look-up table (LUT) operations, with input data of 10 bits and output data of 8 bits; and 7: supports single-input/single-output look-up table (LUT) operations, with input data of 12 bits and output data of 8 bits. src is a name of a SBOX data source file; id0 to id3 respectively correspond to four group values of SBOX, with a range of values of 0 to 3; and a return value int pointer points to four outputs of SBOX, which can be used directly after being called by the SBOX function. A specific realization process of SBOX includes the following steps:

1: considering to use lookup table resources as much as possible, each lookup table being divided into two, upper and lower, sub-lookup tables of 256(D)×32(W), and selecting and searching different sub-lookup tables according to 1-bit group configuration; and in some table lookup modes, selecting which bits of 32 bits as valid data to output according to 2-bit byte_sel configuration;

2: with four tables in each SBOX, dividing each table into eight small tables according to the group configuration and byte_sel configuration; and 3: with realization function of each table being shown as SBOX function realization schemes in table 4, performing relevant encapsulation at the bottom layer of the function according to this table.

TABLE 4

| Model 3bit | group 1bit | byte_sel 2bit | Function |
|---|---|---|---|
| 0 | 0/1 | 0-3 | Parallel 4-way 4bit->4bit table lookup is realized and outputs after the table lookup are spliced.<br>For each way, eight sub-tables in the corresponding table are selected for a table lookup operation, and lower four bits of the 4-way output are selected for splicing, and upper bits thereof are supplemented by 0, and then output to an interface 0. |
| 1 | 0/1 | 0-3 | Parallel 4-way 6bit->4bit table lookup is realized and outputs after the table lookup are spliced.<br>For each way, eight sub-tables in the corresponding table are selected for a table lookup operation, and lower four bits of the 6-way output are selected for splicing, and upper bits thereof are supplemented by 0, and then output to an interface 0. |
| 2 | 0/1 | 0-3 | Parallel 4-way 8bit->8bit table lookup is realized and outputs after the table lookup are spliced.<br>For each way, eight sub-tables in the corresponding table are selected for a table lookup operation, and the 4-way output are selected for splicing, and then output to an interface 0. |
| 3 | 0/1 | — | Parallel 4-way 8bit->8bit table lookup and a XOR operation between bytes after the table lookup are realized.<br>For each way, upper or lower four tables are selected for a table lookup operation, outputs of the four sub-tables of each way are spliced after XOR operation, and finally output to an interface 0. |

TABLE 4-continued

| Model 3bit | group 1bit | byte_sel 2bit | Function |
|---|---|---|---|
| 4 | 0/1 | — | Parallel 4-way 8bit->32bit table lookup is realized. Each table is divided into two, upper and lower, sub-tables of 32*256. Upper or lower sub-tables are selected for a table lookup operation. Outputs of 4-way table lookup are output to interfaces 0, 1, 2 and 3 respectively. |
| 5 | 0/1 | — | 1-way 9bit->9bit table lookup is realized. Each table is divided into two, upper and lower, sub-tables of 32*256. Upper or lower sub-tables are selected for a table lookup operation with lower 8 bits of input data as an index. [8:0] or [24:16] bits of output of the table lookup are selected and output to interface 0 according to the $8^{th}$ bit of the input data, with upper bits being supplemented by 0. |
| 6 | 0/1 | — | 1-way 10bit->8bit table lookup is realized. Each table is divided into two, upper and lower, sub-tables of 32*256. Upper or lower sub-tables are selected for a table lookup operation with lower 8 bits of input data as an index. One of four bytes of output of the table lookup is selected and output to interface 0 according to a bit [9:8] of input data, with upper bits being |
| 7 | 0/1 | — | 1-way 12bit->8bit table lookup is realized. Each table is divided into two, upper and lower, sub-tables of 32*256. Upper or lower sub-tables are selected for a table lookup operation with lower 8 bits of input data as an index. One of four bytes of output of the table lookup is selected as valid data according to a bit [9:8] of input data, and then one of four bytes of output of the lookup table is selected for output according to a bit [11:10] of the input data, with upper bits being supplemented by 0. |

Figure 6:
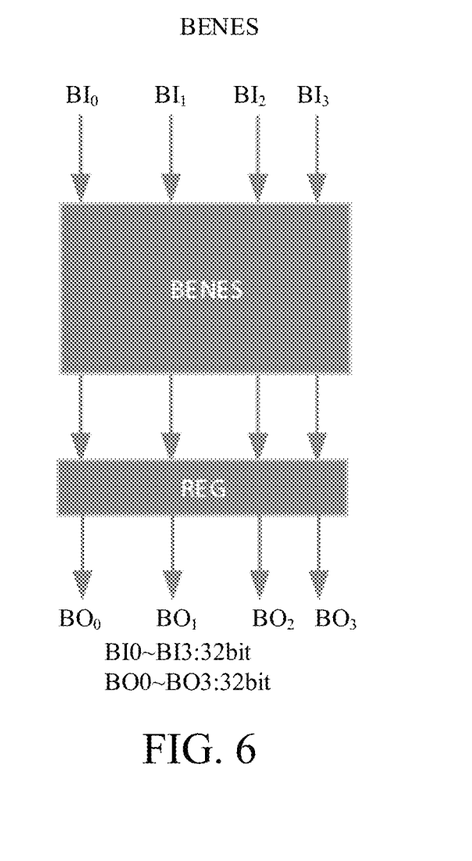
FIG. 6 is a schematic diagram of BENES128 bit according to the present disclosure.

As shown in FIG. 6, the BENES operator is used for realizing a permutation function of nonlinear operation bits. Four 32-bit operands are input and four 32-bit data is output for BENES to realize arbitrary bit permutation of 128-bit data, and RCU contains one 128-bit BENES for bit permutation. The function is defined as int*BENES(int a, int b, int c, int d, char *src), where a, b, c and d are four input parameters of the BENES operator; src is a name of a BENES data source file; and a return value int pointer points to the four outputs of BENES, which can be used directly after being called by the BENES function. A specific realization scheme of BENSE is as follows:
  1. determining input and output function parameters, that is, four 32-bit operands, a, b, c and d, being output;
  2: using a N×N BENES permutation unit so as to realize all selection transformations of N inputs and N outputs at the bottom layer of the function, that is, any one of the N outputs of the N×N permutation unit being capable of selecting any one of the N inputs, and a number of configuration bits required by BENES128 being determined by a formula BENES (N)·length=(n/2)*(2*log 2 (n)−1)=832 bits, where n is a number of bits input by a BENES unit, that is, 128; and
  3: saving permuted data unit for subsequent use.

The intermediate file generation module is configured to convert a data packet generated by the input program through the front-end compilation optimization module into an intermediate file with a fixed format. The intermediate file includes a data flow diagram.

The mapping module is configured to map the input intermediate file into a flow chart of a corresponding algorithm according to a fixed mapping mode. In this part of the present disclosure, the customized C language is converted one by one, and the corresponding operator function is mapped into a fixed operator icon, for example a BFU operator function is mapped to a corresponding BFU operator icon in the array.

The array generation configuration code module is configured to extract configuration information from the mapped flow chart and compress and convert the configuration information in a certain manner into a configuration code. The configuration code can be used for configuring a corresponding hardware architecture. The corresponding hardware architecture, that is, an array configuration code available to RCA.

In the present disclosure, the customized high-level C language can be used as input, and the interpreter arranges and connects computing units such as operators in a manner set by the program according to the input high-level C program, so as to complete the mapping of the whole computing function. The schemes of the present disclosure are integrated in an open source CGRA-ME evaluation framework, and a target architecture file represented by the data stream required for generating the target hardware architecture is compiled.

Technical means disclosed in the schemes of the present disclosure are not only limited to those disclosed in the above embodiments, but also include technical schemes composed of any combination of the above technical features. It should be pointed out that some improvements and modifications can be made by those ordinary persons skilled in the art without departing from the principle of the present disclosure, which should also be regarded to be within the protection scope of the present disclosure.

What is claimed is:

1. An interpreter of a reconfigurable cryptographic algorithm based on customized high-level C language, comprising an input program of cryptographic algorithm customized language, a compilation optimization module, an intermediate file and data flow graph generation module, a mapping module and an array generation configuration code module,
  wherein the input program of the cryptographic algorithm customized language is an input program written in a customized high-level C language;
  the compilation optimization module comprises a software and hardware division unit, a hardware code optimization unit, a hardware code compilation unit and a software compilation link unit, the software and hardware division unit being configured to add comments to a loop body so as to tag a hardware code;
the hardware code optimization unit being configured to rewrite the tagged hardware code according to code specification realized by hardware function;
the hardware code compiling unit comprising a source file and a plurality of functional units for compiling codes; and
the software compilation link unit being configured to link symbols generated in different compilation units to form an executable program;
the intermediate file generation module is configured to convert a data packet generated by the input program through the front-end compilation optimization module into an intermediate file with a fixed format;
the mapping module is configured to map the input intermediate file into a flow chart of a corresponding algorithm in a fixed mapping mode; and
the array generation configuration code module is configured to extract configuration information from the mapped flow chart and compress and convert the configuration information into a configuration code for configuring a corresponding hardware architecture,
wherein the hardware code optimization unit uses Basic Function Unit (BFU), Substitution Box (SBOX) and Benes Network (BENES) operators to optimize the code, and
wherein a process of using the BFU operator for optimization comprises:
determining an operand to be operated and a modular operation mode to be processed according to needs of the algorithm, and assigning three inputs A, B and T of a function and the modular operation mode to be processed respectively;
selecting and determining a BFU function to be realized according to a BFU operator function realization scheme, and transferring a parameter to an operator function func, a specific calculation operator being selected inside the function according to the parameter;
specifying relevant input and output parameters for operators that need to be realized at a bottom layer of the function, and setting according to the BFU operator function realization scheme, and completing final encapsulation; and
transferring parameters to be output to a result output X and a bypass output Y.

2. The interpreter of the reconfigurable cryptographic algorithm based on customized high-level C language according to claim 1, wherein a process of using the SBOX operator for optimization comprises:
using lookup table resources as much as possible, each lookup table being divided into two, upper and lower, sub-lookup tables of 256×32; and selecting and searching different sub-lookup tables according to 1-bit group configuration or selecting which bits of 32 bits as valid data to output according to 2-bit byte_sel configuration;
with four tables in each SBOX, dividing each table into eight small tables according to the group configuration and byte_sel configuration; and
performing relevant encapsulation at a bottom layer of the function according to a SBOX function realization scheme table.

3. The interpreter of the reconfigurable cryptographic algorithm based on customized high-level C language according to claim 1, wherein a process of using the BENES operator for optimization comprises:
determining input and output function parameters;
using a N×N BENES permutation unit to realize all selection transformations of N inputs and N outputs at the bottom layer of the function, that is, any one of the N outputs of the N×N permutation unit being capable of selecting any one of the N inputs, and a number of configuration bits required by BENES128 being determined by a formula $$BENES(N) \cdot \text{length} = \left(\frac{n}{2}\right) * (2 * \log_2(n) - 1);$$

saving permuted data unit for subsequent use.

4. The interpreter of the reconfigurable cryptographic algorithm based on customized high-level C language according to claim 1, wherein the code rewritten by the hardware code optimization unit supports two-level For loop nesting at most.

5. The interpreter of the reconfigurable cryptographic algorithm based on customized high-level C language according to claim 4, wherein when a Loop is with only one level of loop, it is realized by using a single-layer For loop, and the For loop is made by adding a tag according to software and hardware division specification, when a Loop is with two levels of loops, it is realized by using a two-layer For loop, where an outer layer corresponds to a second level of loop, and an inner layer corresponds to a first level of loop, an outer layer of For loop does not need to be added with a tag, and an inner layer of For loop is made by adding a tag according to the software and hardware division specification.

6. The interpreter of the reconfigurable cryptographic algorithm based on customized high-level C language according to claim 1, wherein the tag is used for extracting an innermost loop body, the innermost loop body is mapped to the array for processing, and outside of the loop body is run by software.

7. The interpreter of the reconfigurable cryptographic algorithm based on customized high-level C language according to claim 1, wherein the BENES operator is used for realizing a permutation function of nonlinear operation bits.

8. The interpreter of the reconfigurable cryptographic algorithm based on customized high-level C language according to claim 1, wherein the mapping module maps a corresponding operator function into a fixed operator icon.

* * * * *